United States Patent [19]

North

[11] 4,396,043
[45] Aug. 2, 1983

[54] PRESTRAIGHTENER FOR AXIAL LEAD COMPONENTS

[75] Inventor: Paul C. North, Fredonia, Pa.
[73] Assignee: GTI Corporation, San Diego, Calif.
[21] Appl. No.: 308,579
[22] Filed: Oct. 5, 1981
[51] Int. Cl.³ .............................................. B21F 1/02
[52] U.S. Cl. ........................................ 140/147; 72/92
[58] Field of Search .................. 140/147; 29/835, 838; 72/92, 93, 94

[56] References Cited

U.S. PATENT DOCUMENTS 2,867,262  1/1959  Ainsworth et al. .................. 140/147
3,348,586  10/1967 Campbell et al. ................... 140/147

Primary Examiner—Francis S. Husar
Assistant Examiner—Linda McLaughlin
Attorney, Agent, or Firm—Webb, Burden, Robinson & Webb

[57] ABSTRACT

An apparatus for prestraightening badly bent axial leads on electronic components and the like. The components are seated in notches on the periphery of a carrier disk assembly with the bent leads extending to each side of the assembly. The assembly is rotated about its axis to carry the leads in a circular path. The periphery of the carrier disk assembly is arranged adjacent an inner cylindrical surface or surround surface as it is called. The leads are thus caused to drag and twist against the surround surface. Two notched puller disks are mounted to rotate about nonparallel axes that intersect the axis of the carrier disk assembly at equal and opposite angles. Thus the peripheries of the two puller disks and the carrier disk assembly are closely adjacent at one point on their peripheries at all times. This is the entry point where components are seated in the carrier disk assembly. The puller disks have notches on their peripheries arranged to slidably grip the leads adjacent the component at the entry point. The puller disks are driven at the same angular speed as the carrier disk assembly. Thus as the component is carried away from the entry point it is rolled near the surround surface and the notches slidably griping the leads move apart pulling the badly bent leads substantially straight before the component reaches a stripper that removes it from the notches in the carrier disk assembly. By the time the component reaches the stripper, the notches on the puller disks have become disengaged from the axially extending leads.

5 Claims, 15 Drawing Figures

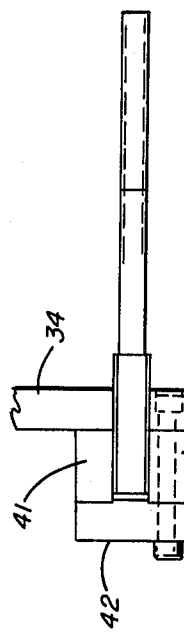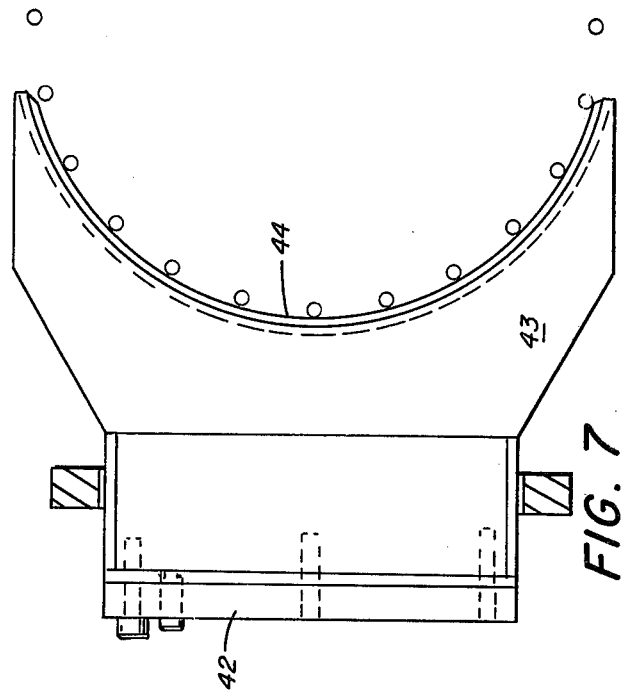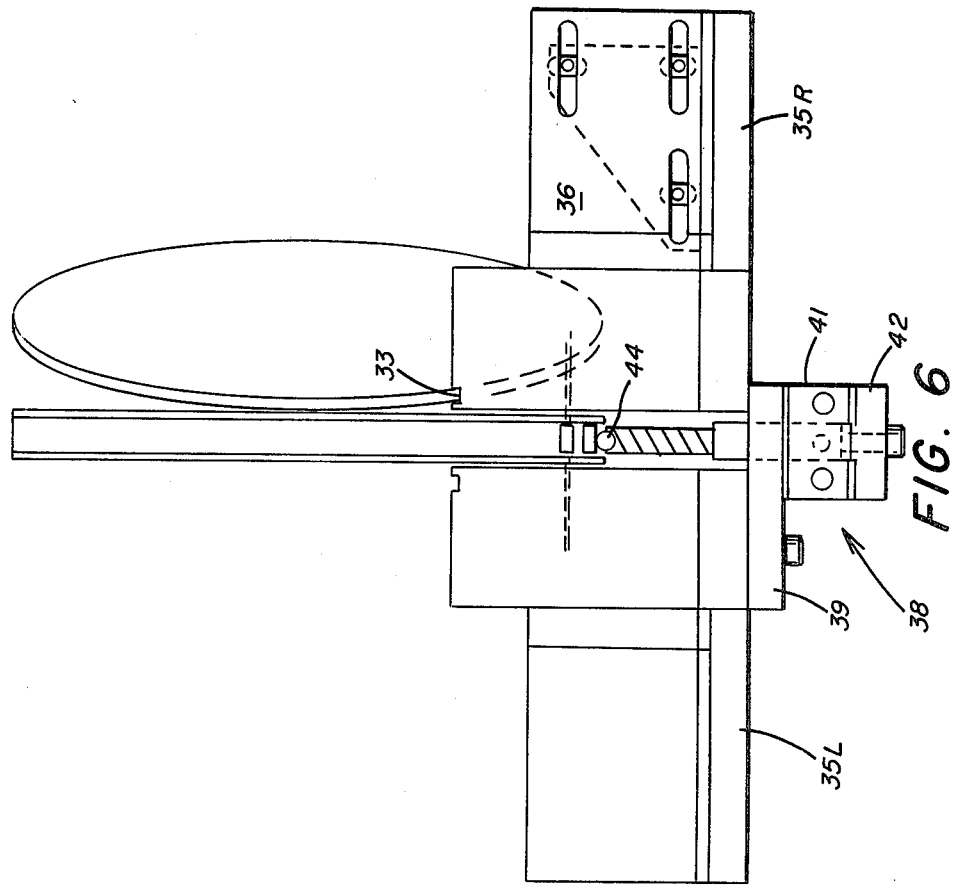

PRESTRAIGHTENER FOR AXIAL LEAD COMPONENTS

BACKGROUND

This invention relates to the art of straightening the leads extending axially outward from electronic components such as resistors, diodes, chemical capacitors and the like. There exist machines for straightening the leads of axial lead components to provide leads that are straight to a high degree of precision. Such devices are currently in use. They have a substantial drawback: unless the leads are reasonably straight to begin with they cannot be handled by these machines. Unfortunately, in the processing of electrical components a large number of components with very badly bent leads gather from time to time. Before they can be processed by conventional lead straighteners, they must be prestraightened by hand. There is a great need for a device, such as disclosed herein, to process components with badly bent leads to straighten the leads at least sufficiently to enable them to be processed by the available precision straighteners.

A number of patented devices are designed to roll the leads between two surfaces in close proximity: Frank et al. U.S. Pat. No. 2,860,686 discloses a component lead straightener device having a notched wheel with extensions to each side. Facing the extension of the wheel are surrounds. Continuously moving belts move over the surface of the surrounds. The component leads must be sufficiently straight to enter the space between the extensions and the belts. The surrounds vibrate to hammer the leads into straightness.

Ainsworth et al. U.S. Pat. No. 2,867,262 teaches rolling the leads between an inner and outer cylindrical surface. Peterson et al. U.S. Pat. No. 2,878,841 teaches rolling leads between two planar surfaces, one surface being the face on a rotating disk. Rus U.S. Pat. No. 3,002,539 discloses a lead straightener which rolls the leads between two rolls while the lead is held at the closest distance between the two rolls. Campbell et al. U.S. Pat. No. 3,348,586 teaches rolling leads between flat belts and rails that are angled toward the entry point so that the leads will be straightened starting adjacent the component and thence axially outward. Bryner et al. U.S. Pat. No. 3,633,643 teaches a device for rolling leads between drums and matching surrounds.

Swanson U.S. Pat. No. 3,739,819 teaches rolling leads against a surround by a frustrum-shaped roller. The surround is conical shaped. This patent claims the apparatus disclosed is able to handle badly bent leads. However, it would appear that it cannot handle the very severely bent leads often encountered. DuBois U.S. Pat. No. 3,744,535 teaches an apparatus for rotating the component body with the leads extending into an ever narrowing space between two surround surfaces. A characteristic of most, if not all, of the devices described so far is that the leads are moved between two surfaces and sometimes are rolled therebetween. Since the surfaces must be close together to perform their function, the leads must be reasonably straight to begin with or they cannot be fed between the surfaces.

Martin et al. U.S. Pat. No. 3,892,263 discloses a lead straightener for severely bent leads comprising first and second corkscrew elements that rotate in opposite directions to grab opposite extending leads before moving apart. The Martin et al. device is not easily adaptable to processing parts rapidly. Note that only one component is being processed at a given instance.

Braden U.S. Pat. No. 3,948,298 discloses a lead straightener that supposedly grabs the leads near the component and pulls away while rotating. With this device, as with Martin et al., only one component is being processed at a given instance.

It is an advantage according to this invention to provide a device for straightening the leads of axial lead components that are severely bent, for instance, bent more than 90 degrees, automatically with very little manual labor and at a high rate (parts per unit time).

SUMMARY OF THE INVENTION

The prestraightener according to this invention comprises a frame assembly that supports the remaining elements. The frame assembly generally will include a base plate with two upstanding side plates attached thereto and a top plate across the side plates and opposite the base plate. A variable speed electrical motor for driving the moving parts is mounted to the base plate. The motor is connected by a chain or belt or other suitable power transfer means to a transfer shaft that is, for example, journaled in the side plates. The remaining moving parts are driven from the transfer shaft. A component feeder is mounted over the top of the top plate for gravity feed of components to an entry point (to be explained). The component feeder may comprise two parallel plates adjustably spaced apart the distance just greater than the axial length of the component bodies being straightened. The two parallel plates have identical slots therein moving from the top edge of the plates to the entry point. The components to be processed are placed between the two parallel plates with one lead in each slot.

Preferably, a conveyor assembly is mounted on the base plate centrally between the two side plates to carry the components that have been processed out of the prestraightener.

A main axle having an adjustable length is positioned horizontally extending toward each side plate but is not directly supported by the side plates. The main axle carries a disk assembly having a plurality of stations around the periphery thereof for receiving the body of components to be processed. This carrier disk assembly is arranged with its faces generally parallel to the parallel side plates. At one point, the periphery of the carrier disk assembly is adjacent the entry point. Preferably, the carrier disk assembly comprises right and left carrier plates that are supported by right and left hubs rotatably mounted on the main axle. The carrier plates have notches in the peripheries thereof for receiving the leads of the components directly adjacent the components. The plates are adjustably spaced apart to the axial length of the components. Hence, at the entry point a component is transferred from the feeder to the carrier plates by falling from out of the slots in the feeder plates into notches in the peripheries of the carrier plates.

Right and left nonrotating puller plate shafts are mounted to the side plates of the frame at an angle to the horizon and intersecting the axis of the main axle at equal and opposite angles.

The main axle is journaled in bores in the right and left puller plate shafts. One of the puller shafts has a movable mount that enables it to be moved toward and away from the side plate with which it is associated. This movement does not change the angle with which the axis of the puller plate shaft intersects the axis of the main axle.

Right and left puller plates are fixed to right and left puller plate hubs respectively which are rotatably secured to the right and left puller plate shafts respectively. The puller plates are thin disks that rotate about a point that is the approximate intersection of the axis of the main axle and the axis of the associated puller plate shaft. Thus, movement of the one puller plate mounting adjusts the distance between the puller plates at all points including the entry point.

The puller plates have notches in the periphery thereof that correspond to the notches in the periphery of the carrier disks. Preferably, the spacing between notches in all disks is the same and equal. Thus the component leads not only enter the notches of the carrier disk when dropping from the feeder at the entry point but also enter notches in the puller plates. The puller plates and the carrier plates are driven at the same angular speed. Preferably, the puller plate hubs have sprockets or sheeves attached thereto so that they may be driven by a chain or belt from the transfer shaft. Preferably, the carrier disk assembly is driven from one or both of the puller plate hubs by plugs extending from the hub of a carrier plate and engaging sockets in the hub of a puller plate disk. The plugs are spaced at, for example, 15 degree intervals. The plugs have a ball shaped exposed end.

Right and left surround surfaces are mounted, for example, to the frame. One of the surround surfaces is adjustable side-to-side, in a preferred embodiment. Preferably, the surround surfaces are cylindrical having a radius of curvature approximately the same as the radius of the carrier disk. It is further preferred that the right and left surround surfaces have a slot therein to receive the periphery of the puller plates. Where a puller plate is adjustable side-to-side, the surround having a slot in which the plate enters must also be adjustable side-to-side. The adjustability, of course, is to enable the processing of components having different axial lengths.

A central surround is adjustably mounted to present a cylindrical surface over which the component is rolled as it is carried by the carrier disk. It is preferably adjustable side-to-side and toward and away from the axis of the main axle. The adjustability enables accommodating components having different diameters. If the diameters of the components being processed are too different, a differently sized central surround will need to be used. Therefore, the central surround should be easily exchanged.

The carrier plates and puller plate disk do not have the same diameter. The ratio of the diameter of the carrier plate to the diameter of the puller plate disks is approximately the cosine of the angle of intersection between the axis of the main axle and either puller plate shaft. A diameter of the puller plate disk passing through the entry point projects (in a direction defined by the axis of the main axle) upon a diameter of the carrier plate. Elsewhere the projection of a diameter of the puller plate disk upon the carrier plate will exceed the diameter of the carrier plate. This excess is greatest 90 degrees from the entry point. This being the case, the notches in the puller plate disk must be deep enough to receive the leads at the 90 degree position. (In the preferred embodiment described hereafter, the notches in the carrier plates are 0.100 inches deep and the notches in the puller plate disks are 0.200 inches deep.) Also the grooves in the side surround surfaces must be deep enough to receive the puller plate disks 90 degrees from the entry point.

As the component is carried away from the entry point, it is rolled and thus the leads are caused to drag against the surround surfaces while rolling. At the same time, the notches on corresponding puller plates move away from the component and thus pull the leads straight away from the component. The pulling and rolling together straighten the leads sufficiently that the components can then be fed to precision lead straighteners. Preferably, the carrier disk is mounted to rotate about one axis and the puller plate disks are mounted to rotate about different axes forming angles α and minus α respectively with the axis of the carrier disk. The absolute valve of the angle α is preferably less than 15 degrees, and the ratio of the diameter of the carrier disk to the puller plate disks is approximately cosine α.

THE DRAWINGS

Further features and other objects and advantages of this invention will become clear from the following description of a preferred embodiment made with reference to the drawings in which FIG. 1 is a side view of a prestraightener according to this invention with the facing side plate and attached elements removed as well as the carrier disk and puller disk assemblies removed but with the online of the carrier disk indicated by dashed lines;

FIG. 6 is a top view showing the central and side surrounds with the central surround sectioned along lines VI—VI shown in FIG. 7 and with the carrier disk and one puller plate shown schematically;

FIG. 7 is a side view of the center surround with certain elements sectioned;

FIG. 8 is a top view of the center surround;

DESCRIPTION OF THE PREFERRED EMBODIMENTS

Figure 1:
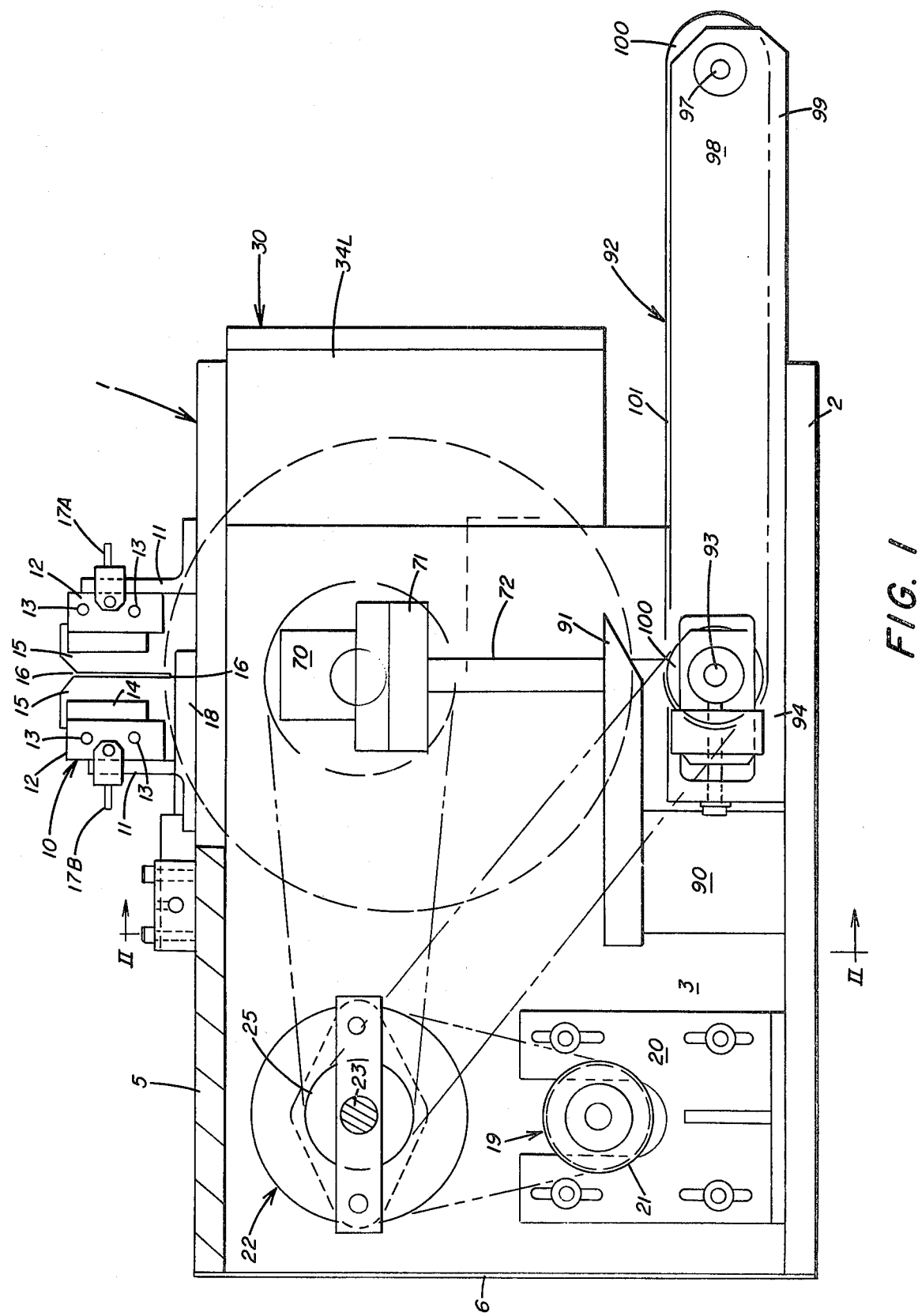
Figure 2:
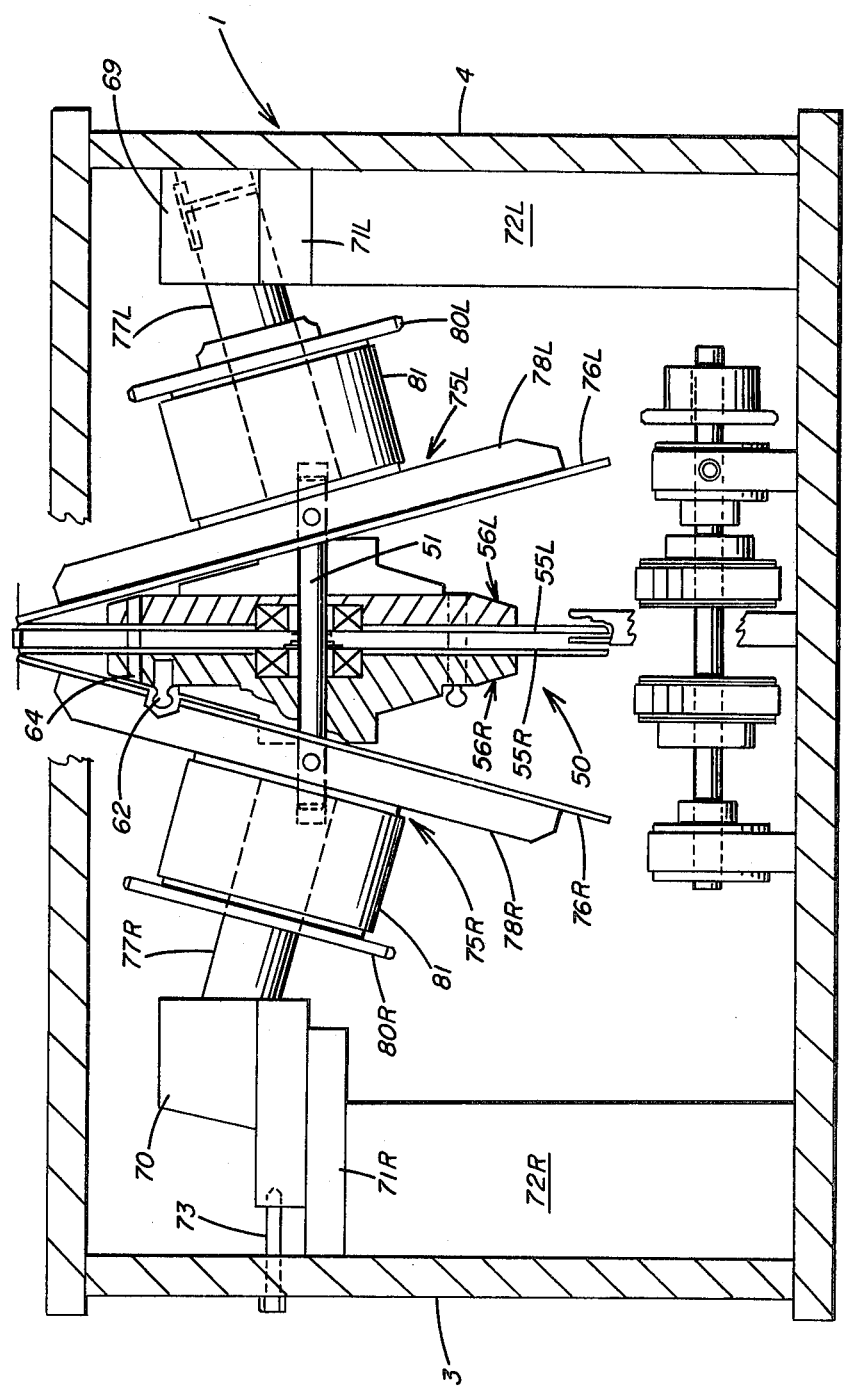
FIG. 2 is a section viewed from the back with certain elements broken away, taken along lines II—II in FIG. 1.

Referring now to FIGS. 1 and 2, the principal subassemblies of the preferred embodiment comprise a frame 1, a feeder 10, motor 19, transfer shaft assembly 22, surround assembly 30, carrier disk assembly 50, puller plate assembly 75R, 75L and discharge conveyor 92. (Throughout this specification right and left components which are substantially identical are referred to by the same numeral followed by an "R" or "L". Right and left components are designated assuming a front view.)

The frame comprises a base plate 2, two side plates 3, 4, a top plate 5, and a back cover 6. The base plate, side plates, top plate and back cover are arranged in a box-like configuration. The front is partially opened and partially filled with the surround assembly 30 hanging thereat.

Figure 3:
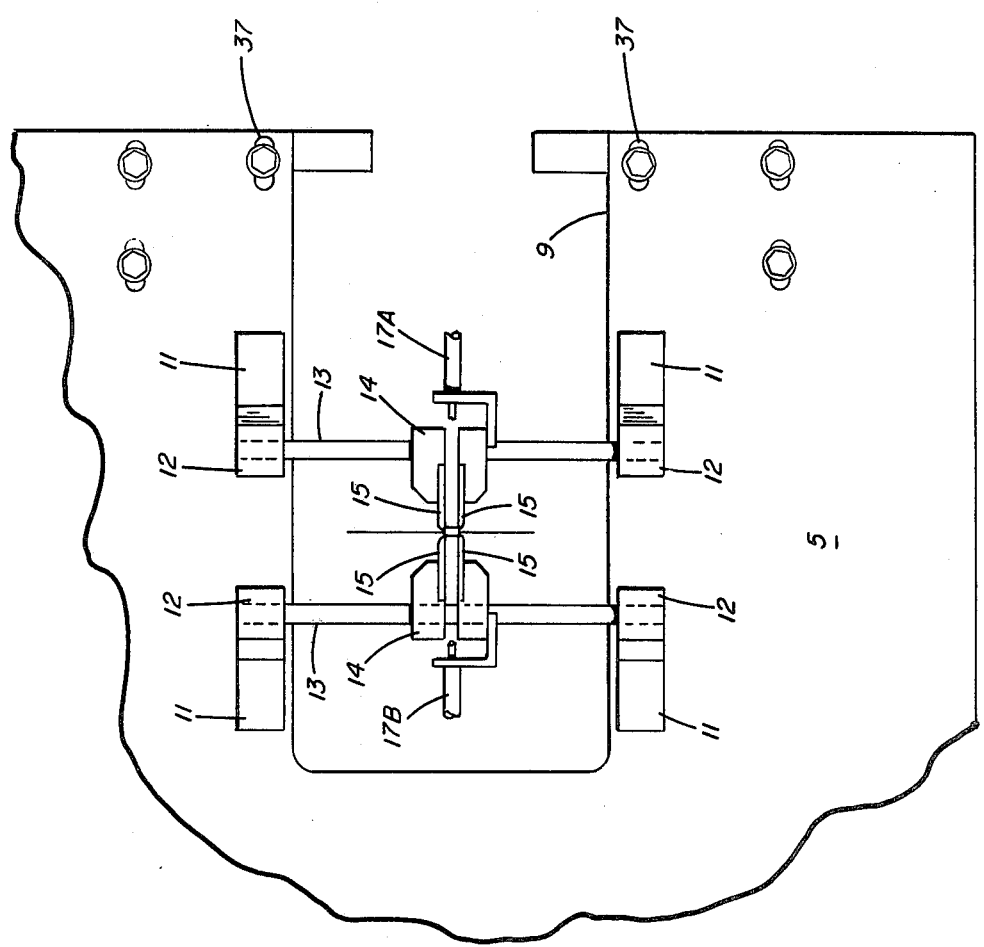
FIG. 3 is a portion of a top view showing the feeder but no elements below the top plate.

The top plate has a portion thereof cutaway and opening to the front. The cutaway portion 9 (see FIG. 3) permits access to the carrier disk assembly 50, portions of which extend above the top plate through the cutaway portion 9. The "entry point", that is, the location where bent lead components are transferred to the carrier disk assembly 50 resides just above the cutaway portion 9 of the top plate 5.

A feeder 10 is secured to the top surface of the top plate 5 and straddles the cutaway portion 9. The feeder comprises four support angles 11, two on each side of the cutaway 9, all fastened to the top surface of the top plate. The support angles each hold support blocks 12. Spanning the cutaway are four feeder support shafts 13 journaled in the support blocks 12. The feeder support shafts are arranged in pairs with one shaft parallel and spaced above the other in each pair. Slidably secured to each pair of support shafts are two feeder blocks 14 that support two parallel guide plates 15. Together the four guide plates define two slots 16 into which the leads of axial lead components may be slid. The feeder blocks can be moved along the feeder shafts 13 to align the components with the carrier disk assembly such that parallel faces of the guide plates 15 are spaced apart just greater than the axial length of the components. Light source 17A and photocell 17B are attached to feeder blocks which are on different pairs of feeder shafts respectively. Thus the filled or unfilled condition of the feeder can be detected. Adjustably attached to the top surface of the top plate (see FIG. 1) is a guide finger 18 for controlling the depth to which a component can move out of the feed slot and into the carrier disk assembly. This enables the adjustment for different size components to prevent more than one component at a time from feeding to the carrier disk assembly.

A motor 19 is adjustably mounted to the base by bracket 20. A sprocket 21 is secured to the output shaft of the motor. A transfer shaft assembly 22 is journaled between the side walls. The power from the motor 19 is transmitted to the transfer shaft assembly and from thereto the remaining elements that require mechanical power. The transfer shaft assembly comprises a shaft 23, input sprocket 24, and three output sprockets 25, one for transfer of power to the discharge conveyor 92 and two that drive the right and left puller plates 76R, 76L in the puller plate assembly 75.

Figure 4:
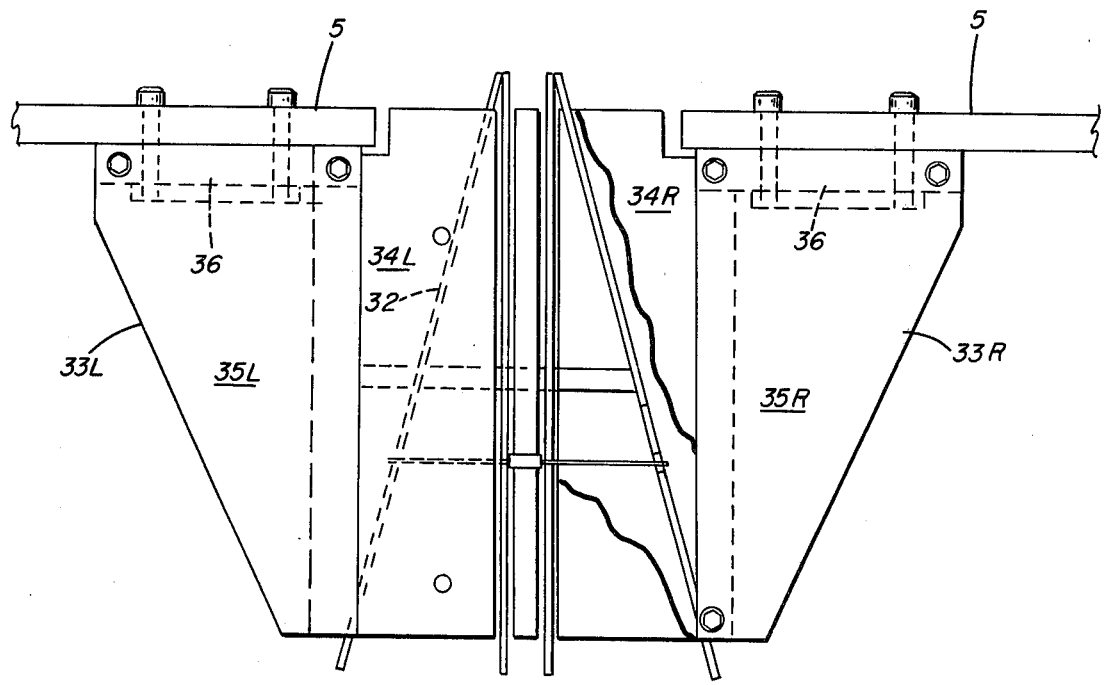
FIG. 4 is a front view of the side surround assemblies positioned relative to the carrier disk assembly shown schematically therebetween.
Figure 5:
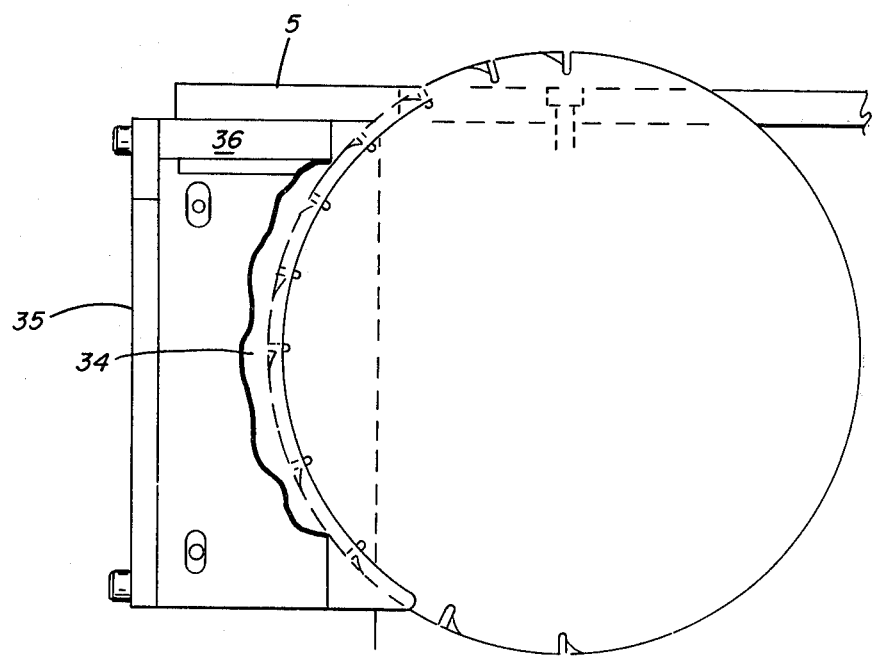
FIG. 5 is a side view of a surround assembly partially broken away shown relative to the carrier disk assembly illustrated schematically.

As shown in FIG. 1, the surround assemblies are mounted to the top plate at the front edge. Referring to FIG. 4, the right and left surrounds 34R and 34L are shown as viewed from the front. For purposes of clarity, the central surround was removed from FIG. 4. The right and left surrounds have internal cylindrical surfaces over which bent components leads are rolled and twisted (see FIG. 5). The surround surface has a center of curvature near the axis of the main axle (to be described). Surrounds are carved from blocks of hard plastic so that tin coated leads, for example, will not be scratched when twisted and dragged therealong. Brackets 33R, 33L support the plastic blocks 34 and have vertical webs 35 fastened to the blocks and horizontal webs 36 with slots 37 (FIG. 3) therein for receiving fasteners to hold the surrounds to the top plate. The top plate 5 has elongate slots perpendicular to the elongate slots in the brackets. Thus the right and left surrounds are adjustable within limits to enable proper set up of the prestraightener. The side surrounds each have grooves 32 cut into the inner cylindrical surfaces thereof for receiving the peripherial edges of the puller plate disks (to be explained). Mounted to the vertical web 35L of the left surround (right and left as used throughout this specification pertain to the top and front views) is the central surround assembly 38.

The central surround assembly is best understood from FIGS. 6, 7, and 8. The purpose of the central surround assembly is to provide a surface over which the component body can be rolled causing it to rotate on its axis as it is carried by the carrier disk assembly. The central surround assembly comprises a front support plate 39 which is bolted to the left surround 34L. In this way, a central surround assembly can be adjusted side-to-side relative to the front and the side surrounds. Spaced from the front support plate 39 by spacer bars 41 is a center adjust bar 42. The center adjust bar is adjustably secured to the spacers and front support plate to move forward and away from the carrier disk assembly. The center surround 43 itself has an inner cylindrical surface that is arranged to receive a soft (elastomeric) insert 44 (similar to a section of an O-ring).

Referring again to FIG. 2, the carrier disk assembly 50 is carried by a main axle 51 which is designed to have an adjustable length. The axle comprises a line-up shaft and two sleeves sidably fitting over the line-up shaft. Snap rings that engage annular grooves on the surface of the line-up shaft restrict the distance between the two shaft sleeves.

The carrier disk assebly 50 comprises right and left carrier plates 55R and 55L and right and left carrier disk hubs 56R, 56L. The carrier plates are supported by the hubs which have bearings supporting them rotatably about the main axle 51.

Figure 9:
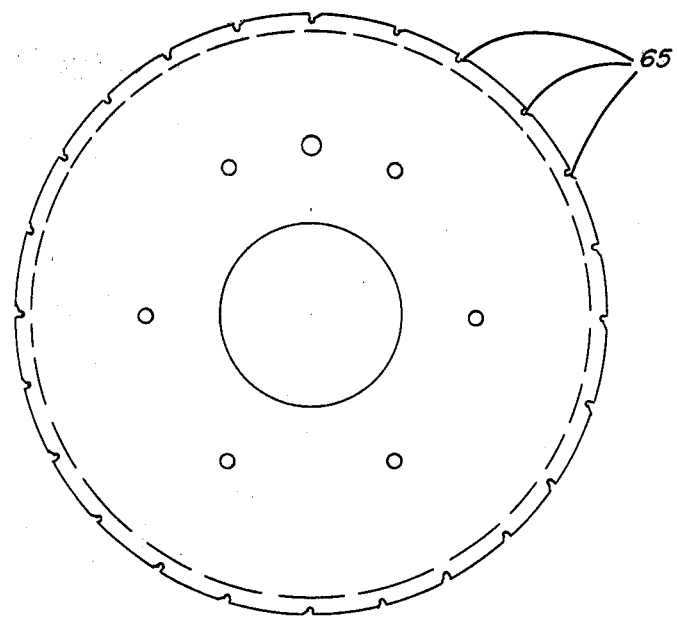
FIG. 9 is a side view of a carrier plate.
Figures 10, 11:
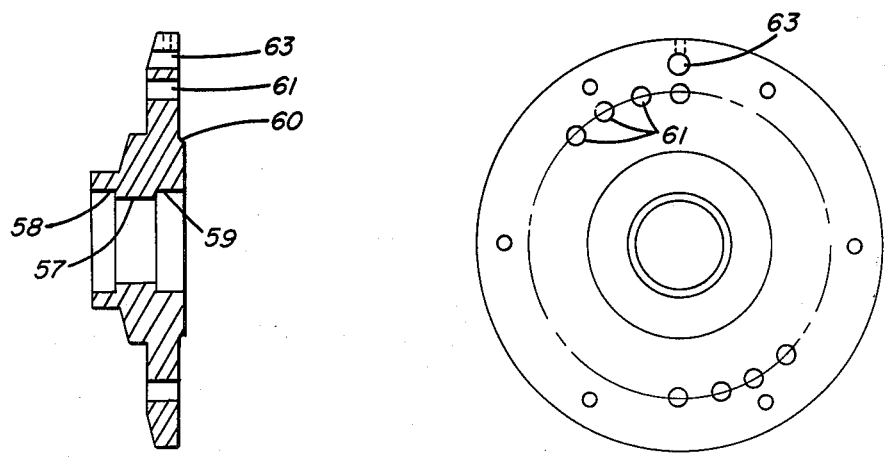
FIG. 10 is a section view of a drive hub for a carrier plate.
FIG. 11 is a side view of a drive hub for a carrier plate.

The carrier disk hubs are best understood from FIGS. 10 and 11. The hubs have a central bore 57 with enlarged bores 58, 59 to receive bearings. A circular ridge 60 on the interior face is sized to receive and center the carrier plate (shown in FIG. 9). The hub has a plurality of holes 61 spaced at about 15 degree intervals at a fixed distance from the axis of the hub. These holes receive drive plug 62 (see FIG. 2). An indexing hole 63 is provided for indexing plug 64 (see FIG. 2) passing between the right and left carrier disk hub so that they turn together about the main axle 51. In the specific embodiment being described, the carrier plates are about eight inches in diameter, 0.093 inches thick and have a tapered peripheral edge. The carrier plates may be made, for example, of Type 302 Stainless Steel. The carrier plates 55 (see FIG. 9) have notches 65 spaced about the periphery thereof at about 15 degree intervals. The notches are, for example, 0.100 inches deep (along a radius of the disk), wide enough to receive a lead wire for example 0.035 inches wide and have a beveled edge leading into the notch enabling a lead wire to gradually lower into the notch. The right and left carrier plates are not identical but are characterized by the direction of the bevel leading to the notch and taper of the edge.

The carrier plates are spaced apart just greater than the axial length of the components, the leads of which are being straightened. Thus axial lead components may rest between the plates with leads resting in corresponding notches.

The main axle 51 is supported by right and left puller plate shafts 77R and 77L which are secured at an angle to the main axis from the side plates 3, 4. The left puller plate shaft is mounted and pinned in fixed block assembly 69 which rests upon shelf 71L supported by buttress 72L. The right puller plate shaft is mounted in adjustable block 70 which slides over shelf 71R supported by buttress 72R. The block 70 is positionable by bolt 73 passing through side plate 3. Thus the distance between puller shafts can be adjusted. Bores in the nonfastened end of the puller shaft 77R and 77L (which bores have axes intersecting the shaft axis at an angle of about 15 degrees) receive and support the main axle 51.

Figure 15:
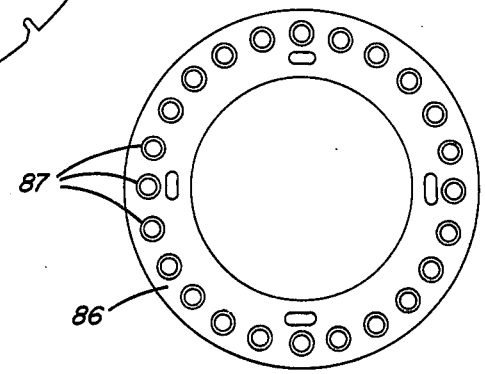
FIG. 15 is a side view of a socket plate.
Figure 13:
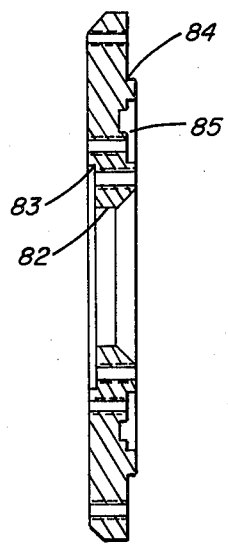
FIG. 13 is a section view of a drive hub for a puller plate.
Figure 14:
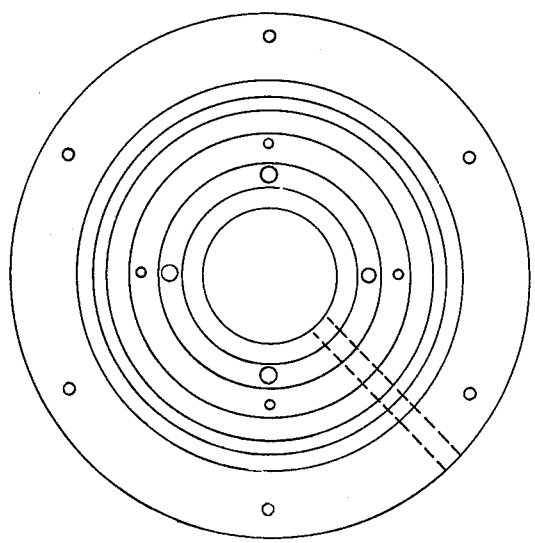
FIG. 14 is a side view of a drive hub for a puller plate.

Rotatably mounted by bearings to each puller shaft 77R, 77L are puller plate hubs 78R, 78L. Also mounted to the puller plate shafts by bearings are puller plate sprockets 80R, 80L. Spacers 81 interconnect the sprockets 80 and hub 78. Thus if the sprockets are driven so are the hubs. The puller plate hubs are best understood from FIGS. 14 and 15. The puller plate hubs have a central bore 82 for clearing the puller plate shaft and a recess bore 83 for receiving a bearing to mount the hub to the shaft. The hub has a circular ridge 84 for centering the puller plate disks (see FIG. 12) and an annular recess 85 for receiving the drive plate 86 (see FIG. 15). The drive plate 86 fits into and is fastened to the annular recess 85. The drive plate has a plurality of holes or sockets 87 for receiving the drive plugs attached to the right carrier plates. The sockets 87 are spaced at 15 degree intervals and have beveled edges to facilitate meshing with the sprocket plugs.

Figure 12:
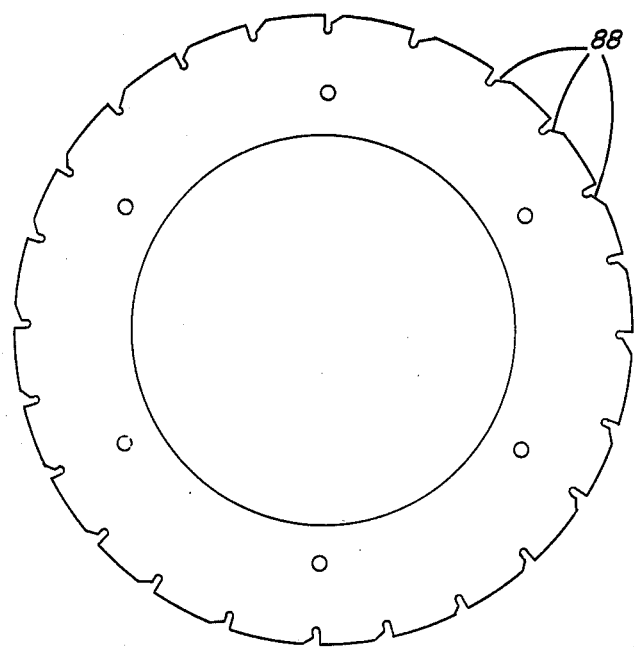
FIG. 12 is a side view of a puller plate.

The puller plates 76R, 76L are illustrated in FIG. 12. The puller plates have a plurality of peripheral notches 88 very similar to those described for the carrier plates. However, the notches are deeper, say, 0.200 inches deep. The puller plates have a diameter of 8.282 inches in the embodiment being described. The plates are 0.93 inches thick and are made of a tough plastic material such as DuPont's (an acetal resin) DELRIN. The diameter of the puller disk is about the diameter of the carrier disks divided by the cosine of 15 degrees. The inner face (the face adjacent the carrier disk) of the puller plate disk is arranged to lie in a plane that passes through the intersection of the axis of the main axle and the axis of the puller plate shaft upon which it is mounted. Thus, the right carrier disk and right puller plate disk touch or almost touch at their topmost positions. This is also true for the left carrier disk and left puller plate disk. The touching position is the "entry point" where bent axial lead components are fed to the carrier disk assembly. The carrier plates and puller plates rotate together at the same angular speed. Thus adjacent notches on the plates at the topmost position are spread apart at the bottommost position (about two inches apart in the embodiment illustrated). In other words, adjacent notches on corresponding carrier and puller disks move apart about two inches with the 180 degrees rotation of the disks.

Referring to FIG. 1, below the carrier disks is a stripper assembly 90 having a finger 91 forcing the components out of the notches in the carrier disks is a stripper assembly 90 having a finger 91 forcing the components out of the notches in the carrier disk. A conveyor 92 is mounted to the base plate 2. The conveyor has a back conveyor shaft 93 journaled in back bearing standards 94 and a front conveyor shaft 97 journaled in front bearing standards 98. The front bearing standards 98 are supported by a conveyor plate 99 extending out of the front of the frame. Belt wheels 100 are mounted on the front and back conveyor shafts. Elastic belts 101 wrap the belt.

OPERATION

Axial lead components with badly bent leads are stacked in the feeder 10 with leads in the slots 16. The components fall by force of gravity to the entry point at the bottom of the slots to the carrier disk assembly 50. The leads of the lowermost components ride upon the periphery of the carrier plates and puller plate disks and then drop into the notches on the periphery of the disks. The finger 18 prevents more than one component from settling into one set of notches. The component is then carried by the disks to the surround assembly. The component body first contacts the center surround 38 against which it is caused to roll. As the component is carried away from the entry point, the notches in the corresponding carrier disk and puller plate disk begin to move apart and begin to pull the leads straight. Next, the component reaches the side surround assembly and the notches on the edges of the puller disks enter the slots 32 in the side surrounds pushing the leads of the components against the surround. The separation of the notches on the carrier and puller disk continue pulling the leads straight. At this time, the component is being rolled against the center surround. Thus the leads are dragged against the side surrounds and twisted. The combination of the pulling and twisting action on the leads straightens them. As the component is carried past the side surround, the notches are so spread that the puller plate notches disengage from the leads. The component is carried by the carrier plates to a stripper which pushes the component out of the notches and onto the exit conveyor.

Having thus described the invention with the detail and particularity required by the Patent Laws, what is desired protected by Letters Patent is set forth in the following claims.

I claim:

1. An apparatus for straightening badly bent leads on axial lead components comprising:
    inner cylindrical surfaces,
    means comprising a carrier disk assembly including at least one carrier disk for causing components to roll near said inner cylindrical surfaces against which the leads drag and twist, and
    means comprising two notched puller disks mounted to rotate about nonparallel axes at the same angular speed as the at least one carrier disk rotates about its axis, said notches on said puller disks arranged to slidably engage the leads of a component adjacent the component at a first angular position of said notched puller disks and to pull the leads outward from the component as the two disks are rotated away from said first angular position,
    whereby the leads are pulled and rolled to be substantially straight.

2. An apparatus according to claim 2 wherein the carrier disk is mounted to rotate about one axis and the puller plate disks are mounted to rotate about different axes forming angles $\alpha$ and minus $\alpha$ respectively with the axis of said carrier disk, the absolute value of the angle $\alpha$ being less than 25 degrees, and the ratio of the diameter of the carrier disk to the puller plate disks being approximately cosine $\alpha$.

3. An apparatus according to claim 3 wherein a puller plate disk rotates about a point being the intersection of the axis of the carrier disks and the axis of said puller plate disks.

4. An apparatus for improving the straightness of badly bent leads extending from axial lead components comprising:
- a support frame;
- a main axle having a generally horizontal axis;
- carrier means journaled on the main axle having a plurality of stations for receiving the components;
- right and left shafts mounted to opposite sides of said support frame, each shaft with an axis that intersects the horizontal axis at an equal and opposite angle, said shafts having nonaxial bores therein for receiving the main axle;
- right and left puller plates rotatably fixed to right and left shafts respectively, said puller plates having a plurality of notches on the peripheries thereof for slidably gripping the leads on opposite sides of the axial lead components when said components are seated in the stations of the carrier means;
- means for rotating the puller plates and means for interconnecting the carrier means and puller plates so that they all rotate at the same angular velocity;
- means for delivery components having bent leads to an entry point being where the carrier means and puller plates are in closest proximity;
- surround surfaces having radii of curvature substantially the same as the radius of the carrier means extending axially away from the carrier means;
- such that components with badly bent axial leads may be placed into a station on the carrier means with leads on the notches of the puller disks at the entry point, and as the carrier means is rotated the component is carried in a circular path and rotated near the surround surface and during which rotation the notches of the puller disks move away from the carrier means whereby the leads are pulled outwaard and rolled to cause substantial straightening of said leads.

5. An apparatus for improving the straightness of badly bent leads extending from axial lead compoments comprising:
- a support frame;
- a main axle having a generally horizontal axis;
- carrier plate journaled on the main axle having a plurality of notches in the peripheries thereof such that a component can be received between the carrier plates and held by the axially extending leads seated in said notches;
- right and left shafts mounted to opposite sides of said support frame, each shaft with an axis that intersects the horizontal axis at an equal and opposite angle, said shafts having nonaxial bores therein for receiving the main axle;
- right and left puller plates rotatably fixed to right and left shafts respectively, said puller plates having a plurality of notches on the peripheries thereof for slidably gripping the leads on opposite sides of the axial lead components when said component leads are seated in the notches of the carrier plates;
- means for rotating the puller plates about their axes and means for interconnecting the carrier plates and puller plates so that all plates rotate at the same angular velocity;
- means for delivering components having bent leads to an entry point comprising where corresponding notches on the carrier and puller plates are in closest proximity;
- right and left surround surfaces being inner cylindrical surfaces having radii of curvature substantially the same as the radius of the carrier disks extending axially away from the carrier disks;
- a central surround being an inner cylindrical surface having a diameter somewhat larger than the diameter of the carrier disks against which the components roll as they are carried by the carrier disks;
- such that components with badly bent axial leads may be placed into the corresponding notches of the carrier and puller disks at the entry point, and as the carrier disks are rotated the component is carried in the circular path and rolled over the central surround surface to cause rotation and during which rotation the notches of the puller disks move away from the corresponding notches in the carrier disks whereby the leads are pulled outward and twisted to cause substantial straightening of said leads.

* * * * *

UNITED STATES PATENT AND TRADEMARK OFFICE
CERTIFICATE OF CORRECTION

PATENT NO. : 4,396,043
DATED : August 2, 1983
INVENTOR(S) : Paul C. North

It is certified that error appears in the above-identified patent and that said Letters Patent are hereby corrected as shown below:

Column 6 Line 33 "sidably" should read --slidably--.

Column 6 Line 37 "assebly" should read --assembly--.

Column 7 Lines 63, 64 & 65
Delete --disks is a stripper assembly 90 having a finger 91 forcing the components out of the notches in the carrier--.

Claim 2 - Column 8 Line 61 "claim 2" should read --claim 1--.

Claim 3 - Column 9 Line 1 "claim 3" should read --claim 2--.

Claim 4 - Column 9 Lines 39 & 40 "outwaard" should read --outward--.

Claim 5 - Column 9 Line 43 "compoments" should read --components--.

Signed and Sealed this

Fourth Day of October 1983

[SEAL]

Attest:

GERALD J. MOSSINGHOFF

Attesting Officer   Commissioner of Patents and Trademarks